United States Patent
Chana et al.

(10) Patent No.: US 10,816,509 B2
(45) Date of Patent: Oct. 27, 2020

(54) REACTANCE MEASUREMENT

(71) Applicant: Oxford University Innovation Limited, Oxford, Oxfordshire (GB)

(72) Inventors: Kamaljit Singh Chana, Oxford (GB); Jonathan Shamus Sullivan, Fleet (GB)

(73) Assignee: OXFORD UNIVERSITY INNOVATION LIMITED, Oxford, Oxfordshire (GB)

( * ) Notice: Subject to any disclaimer, the term of this patent is extended or adjusted under 35 U.S.C. 154(b) by 89 days.

(21) Appl. No.: 16/070,869

(22) PCT Filed: Jan. 17, 2017

(86) PCT No.: PCT/GB2017/050102
§ 371 (c)(1),
(2) Date: Jul. 18, 2018

(87) PCT Pub. No.: WO2017/125721
PCT Pub. Date: Jul. 27, 2017

(65) Prior Publication Data
US 2019/0025255 A1     Jan. 24, 2019

(30) Foreign Application Priority Data
Jan. 18, 2016 (GB) .................................. 1600881.5

(51) Int. Cl.
*G01N 27/90* (2006.01)
*G01R 27/02* (2006.01)
*G01N 27/02* (2006.01)

(52) U.S. Cl.
CPC ....... *G01N 27/9033* (2013.01); *G01N 27/023* (2013.01); *G01N 27/9046* (2013.01); *G01R 27/02* (2013.01)

(58) Field of Classification Search
None
See application file for complete search history.

(56) References Cited

U.S. PATENT DOCUMENTS 6,373,235 B1    4/2002   Barker
2001/0020846 A1 9/2001   Miyata
(Continued)

FOREIGN PATENT DOCUMENTS

EP   2 669 621   12/2013
FR   2 576 690    8/1986
(Continued)

OTHER PUBLICATIONS

Great Britain Search Report dated Jul. 14, 2016 issued in Great Britain Patent Application No. 1600881.5, 3 pp.
(Continued)

*Primary Examiner* — Jas A Sanghera
(74) *Attorney, Agent, or Firm* — Nixon & Vanderhye P.C.

(57) ABSTRACT

Apparatus and methods for reactance measurements are disclosed. The apparatus and methods are particularly suitable for eddy current proximity sensors in turbo-machine assemblies. In one arrangement, there is provided an apparatus comprising a circuit for receiving a sensing component of a sensor. The circuit has a unit having fixed reactance. An electrical source is provided for driving an alternating current through the circuit. An analysis unit measures the phase of a signal in the circuit that is dependent on the reactance of the sensing component. A measure of the reactance of the sensing component is output based on the measured phase.

20 Claims, 5 Drawing Sheets

(56) References Cited

U.S. PATENT DOCUMENTS

| | | | | |
|---|---|---|---|---|
| 2005/0271162 A1* | 12/2005 | Goth | ................... | H03F 1/3211 |
| | | | | 375/317 |
| 2007/0001663 A1* | 1/2007 | Hrubes | .................. | G01P 3/481 |
| | | | | 324/164 |
| 2008/0278155 A1* | 11/2008 | Magnusson | ............ | G01B 7/105 |
| | | | | 324/234 |

FOREIGN PATENT DOCUMENTS

| | | |
|---|---|---|
| JP | 2012-215542 | 11/2012 |
| WO | WO 2007/034519 | 3/2007 |

OTHER PUBLICATIONS

Masters, Robert M., "Technique for Temperature Compensation of Eddy-Current Proximity Probes," NASA Technical Paper 2880, Jan. 31, 1989, Retrieved from the Internet: URL:https://ntrs.nasa.gov/archive/nasa/casi.ntrs.nasa.gov/19890006009.pdf [retrieved on Mar. 2, 2017], pp. 1-8.

PCT International Search Report dated Mar. 29, 2017 issued in PCT International Patent Application No. PCT/GB2017/050102, 3 pp.

\* cited by examiner

REACTANCE MEASUREMENT

This application is the U.S. national phase of International Application No. PCT/GB2017/050102 filed Jan. 17, 2017 which designated the U.S. and claims priority to Great Britain Patent Application No. 1600881.5 filed Jan. 18, 2016, the entire contents of each of which are hereby incorporated by reference.

The invention relates to the measurement of reactance, particularly in the context of measuring the reactance of a sensing component such as a coil in a sensor. The invention is particularly applicable to proximity sensing in turbo-machine assemblies.

Sensors which comprise a coil whose reactance changes as a function of the proximity of a target object are well known. A class of these sensors are sometimes referred to as eddy current sensors. The normal approach for obtaining an output from such sensors is to monitor the amplitude of a response of the coil to an applied voltage or current. When a metallic object is brought close to the coil, significant eddy currents are generated in the object and the amplitude of the response changes. Detection of this change in amplitude can thus be used to detect the presence of the object.

Existing eddy current sensors are relatively effective at detecting regular (i.e. modulated) changes in a separation between a target object and the sensor. However, various factors such as drift and signal interference have made it challenging for eddy current sensors to provide accurate absolute measurements of separation, particularly where the separation is nominally static (i.e. not modulated) during normal use. For example it has been difficult to use eddy current sensors to measure nominally static separations such as those that exist adjacent to the surfaces of rotating shafts or discs in turbo-machines assemblies.

The provision of accurate and reliable proximity sensors is particularly challenging in high temperature environments, for example at temperatures higher than 300° C. Such temperatures, and considerably higher temperatures, can be encountered for example in turbo-machine assemblies and other machines having high energy rotating components. Proximity sensors are needed in such applications for performance measurement, condition monitoring or development related analyses. As a particular example proximity sensors are used for measuring the clearance between blade tips and a surrounding casing in a turbo-machine assembly. The assembly may be part of a jet engine for an aircraft for example.

In the case of a jet engine for an aircraft, leakage of gas between the blade tips and the surrounding casing will significantly reduce the efficiency of the assembly. In many applications it is difficult to prevent such leakage completely. Forces, torques and heat loads applied to the assembly in use will tend to distort both the blade and the surrounding casing. These distortions will tend to change the clearance between the blades and the casing. In many applications the nominal clearance is set so that contact between the blades and the casing will not occur to an excessive extent, or at all, even under the most unfavourable conceivable conditions (i.e. the conditions that would be most likely to cause such contact). This approach allows the assembly to operate safely but is relatively inefficient because the clearance will tend to be larger than necessary for most operating conditions.

For example, in an aircraft engine extreme events such as take-off, aborted landing or engine restart during flight will involve heat loads and forces/torques on the engine that are very different to those experienced during the rest of the of the flight. Setting a nominal clearance which is such that the blades will not touch the casing excessively during such extreme events may mean that the clearance is larger than necessary for the rest of the flight, significantly increasing fuel costs. In addition, the engine needs to work harder to achieve the same output power, which may affect engine longevity.

Prior art systems have been developed to mitigate the above problem by controlling the shape and/or the size of the casing during use. This is sometimes referred to as clearance control. For example, in the context of an aircraft engine it is known to cool the casing during a cruising phase so that it contracts and reduces the clearance. This may be done "passively" (i.e. without reference to measurements of the actual clearance or detailed predictions of the clearance). However, active clearance control is also possible. Active clearance control might involve driving of actuators or temperature control systems in response to measurements of the clearance for example. However, it is challenging to provide a sensor for measuring clearance that is sufficiently robust, reliable and accurate. This is particularly the case in the context of an aircraft engine where operating temperatures are very high. Capacitive or optical sensing of the clearance is in principle possible but sensors based on these operating modes have been found to degrade quickly in use and be generally vulnerable to contamination or unpredictable loss of function.

It is an object of the invention to provide reactance measurement apparatus and related devices and methods that at least partially address one or more of the problems mentioned above.

According to an aspect of the invention, there is provided a reactance measuring apparatus for measuring the reactance of a sensing component in a sensor, comprising: a circuit configured to receive the sensing component and comprising a unit having fixed reactance; an electrical source configured to drive an alternating current through the circuit; and an analysis unit configured to: measure the phase of a signal in the circuit that is dependent on the reactance of the sensing component of the sensor; and output a measure of the reactance of the sensing component based on the measured phase.

Thus, an apparatus is provided which uses a measured phase rather than amplitude as the basis to detect a reactance of the sensing component. In contrast to prior art arrangements based on amplitude measurements, the present invention provides consistently high sensitivities, allowing reliable detection of small changes in the reactance of a sensing component, even in the context of nominally static (rather than modulated) measurements.

The sensing component may be or comprise a coil, a capacitor, or any other component or group of components having a reactance which provides information relevant to the sensing purposes of the sensor.

In an embodiment, an alternating output from an electrical source is converted to a balanced differential signal which is fed to the sensor through units having fixed reactance. The use of a balanced differential signal provides high common mode rejection of noise. Interference will be imposed on both signals equally and oppositely and is largely self cancelled.

In an embodiment, two limiting amplifiers are provided to convert sinusoidal signals to square wave signals limited to preset levels regardless of noise and amplitude changes of the input. A phase dependent on the reactance of the sensing component, relative to a phase of the electrical source, is obtained by comparing square wave signals output from the limiting amplifiers. This arrangement makes it possible to obtain a measurement of phase with high reliability and accuracy even in the presence of significant amplitude variations or noise.

In an embodiment, an analogue voltage proportional to the measured phase is obtained. In an embodiment the analogue voltage is obtained using a phase locked loop phase detector and low pass filter. An output voltage that is linear with phase to high precision is thereby obtained. Thus, a DC output suitable for static measurements is available. In an embodiment, the arrangement is used to monitor nominally static separations between shafts or discs and other components in turbo-machine assemblies.

In an embodiment the resistance of the sensing component is measured in order to determine the temperature of the sensing component. The measured temperature can then be used to correct for temperature effects which would otherwise reduce the accuracy of the measurement of the reactance of the sensor.

According to an aspect of the invention, there is provided a method of measuring the reactance of a sensing component in a sensor, comprising: driving an alternating current through a circuit comprising the sensing component and a unit having fixed reactance; measuring the phase of a signal in the circuit that is dependent on the reactance of the sensing component; and outputting a measure of the reactance of the sensing component based on the measured phase.

Embodiments of the invention will now be described, by way of example only, with reference to the accompanying drawings in which corresponding reference symbols indicate corresponding parts, and in which.

Figure 1:
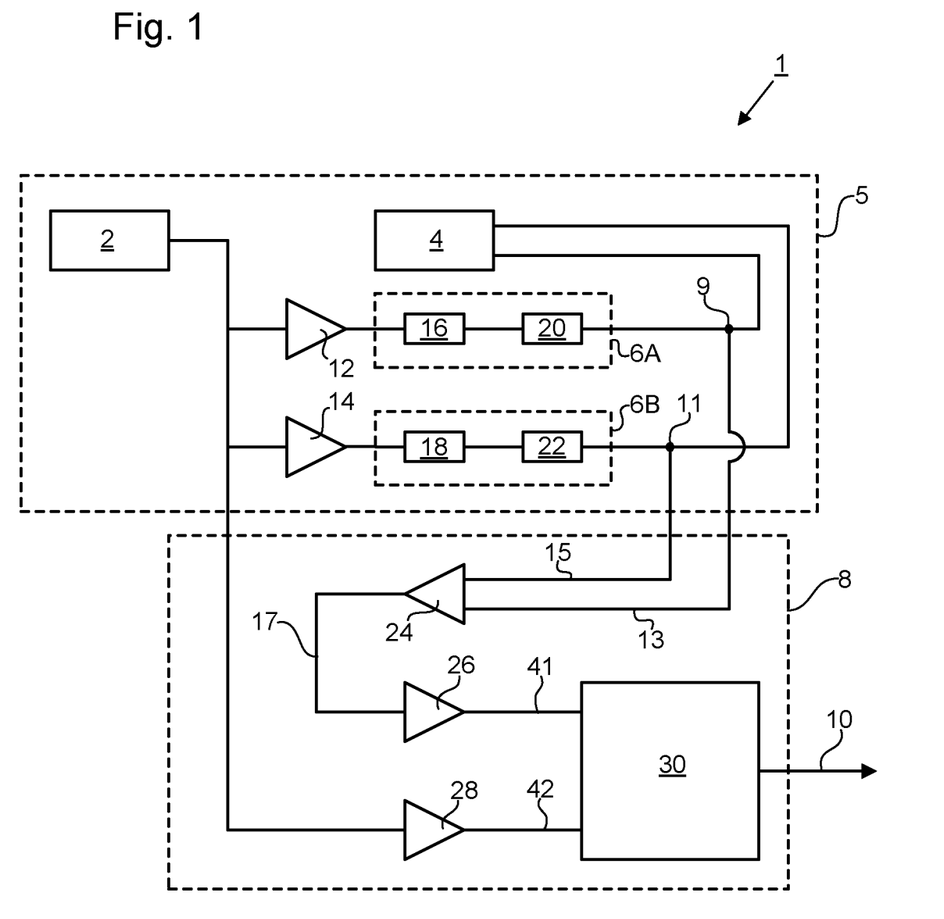
FIG. 1 depicts schematically a reactance measuring apparatus according to an embodiment.

In an embodiment, a reactance measuring apparatus 1 is provided. An example of such a reactance measuring apparatus is shown in FIG. 1. The reactance measuring apparatus 1 is configured to measure the reactance of a sensing component such as a coil or capacitor in a sensor 4. The reactance of the sensing component is used to obtain the output of the sensor 4 and is therefore related (e.g. proportional to) the quantity (e.g. proximity of a target object) that the sensor 4 is configured to sense or measure. The apparatus 1 comprises a circuit 5 configured to receive the sensing component. For example, the circuit 5 comprises connectors (not shown) for connecting the sensing component to the circuit 5.

The circuit 5 comprises a unit 6A, 6B having a fixed reactance. The fixed reactance is a finite reactance. In an embodiment the reactance is formed using a combination of capacitors and inductors.

The circuit 5 further comprises an electrical source 2. The electrical source 2 is configured to drive an alternating current through the circuit 5. In an embodiment, the electrical source 2 comprises a Direct Digital Synthesiser (DDS). The DDS comprises a high purity sine wave source under microprocessor control. Various frequencies may be used. In one example, a frequency of 1.25 MHz was found to be effective.

The apparatus 1 further comprises an analysis unit 8. The analysis unit 8 is configured to measure the phase of a signal in the circuit 5 that is dependent on the reactance of the sensor 4. The analysis unit 8 is further configured to provide an output signal 10 that is a measure of the reactance (e.g. proportional to the reactance) of the sensing component based on the measured phase.

In an embodiment, the electrical source 2 is configured to drive the alternating current through the sensing component via the unit 6A,6B having fixed reactance. In this case the phase measured by the analysis unit 8 is the phase of a signal generated at a reference point 9, 11, between the sensing component and the unit 6A,6B having fixed reactance. In the embodiment shown two units 6A,6B having fixed reactance are provided, with two corresponding reference points 9, 11. This is not essential. In other embodiments a single unit having fixed reactance and a single corresponding reference point may be provided.

In an embodiment the circuit 5 is configured simultaneously to drive equal and opposite alternating currents through the sensing component via respective first and second units 6A,6B having fixed reactance. FIG. 1 illustrates an embodiment of this type. In this particular example, the first unit 6A comprises an inductor 16 and a capacitor 20 and the second unit 6B comprises an inductor 18 and a capacitor 22. In an embodiment the reactance of the first unit 6A is equal to the reactance of the second unit 6B. In an embodiment the equal and opposite alternating currents are obtained using two complementary driver amplifiers 12 and 14. Driver amplifier 12 is configured to invert. Driver amplifier 14 is configured not to invert.

The analysis unit 8 in this embodiment is configured to combine a first signal 13 with a second signal 15. The first signal 13 is obtained at a first reference point 9 between the sensing component and the first unit (comprising components 16 and 20 in this example). The second signal 15 is obtained at a second reference point 11 between the sensing component and the second unit (comprising components 18 and 22 in this example). The phase measured by the analysis unit 8 is a phase of a signal 17 obtained by the combining of the first and second signals 13 and 15.

In an embodiment the first and second signals 13, 15 are combined in a differential amplifier 24. The differential amplifier 24 outputs the signal 17 as a single sine wave at the carrier frequency of the source 2 (e.g. of the order of 1.25 MHz) but typically out of phase by around 90 degrees. The phase is largely determined by a combination of the frequency of the source 2, the reactance of the unit 6A,6B of fixed reactance, and the reactance of the sensing component and connecting cables. The phase is thus dependent on the reactance of the sensing component and thereby provides a measure of the reactance of the sensing component.

The use of a balanced differential signal as described above provides high common mode rejection of noise. Interference will be imposed on both of the lines between the first and second units 6A,6B and the sensing component equally and oppositely and will largely self cancel.

In the embodiment shown, the apparatus 1 further comprises a first limiting amplifier 26 and a second limiting amplifier 28. A limiting amplifier is a special class of operational amplifier designed to follow its input signal but is limited to preset levels. The preset levels may for example be set to plus and minus 2V for example. With increasing gain, the limiting amplifier will produce a clean square wave in phase with its input signal but limited in amplitude regardless of noise and amplitude changes of the input.

The signal 17 output by the differential amplifier 24 is input to the first limiting amplifier 26. An output from the source 2 is input to the second limiting amplifier 28. Signals 41 and 42 respectively from the first and second limiting amplifiers 26 and 28 are square waves of constant amplitude which maintain an identical phase to the variable analogue signals input to the first and second limiting amplifiers 26,28.

Signals 41 and 42 are input to output unit 30. Output unit 30 is configured to output an analogue signal 10 proportional to a difference in phase between the input signals 41 and 42.

Figure 2:
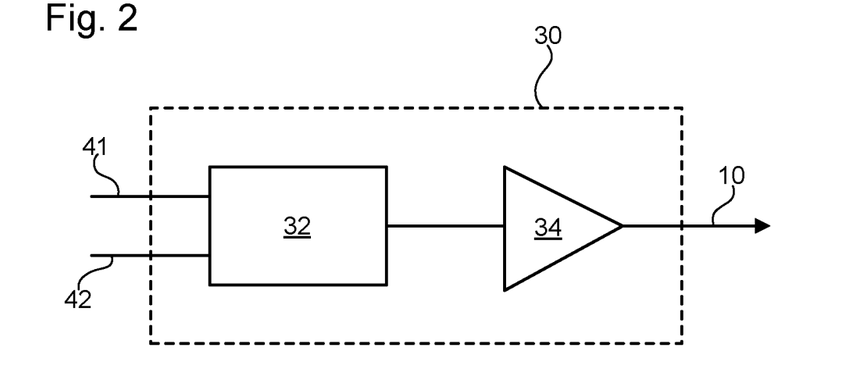
FIG. 2 depicts schematically a portion of an analysis unit configured to output an analogue voltage proportional to a measured phase.

FIG. 2 depicts an example configuration for the output unit 30. In this example signals 41 and 42 are input to a phase locked loop (PLL) phase detector (PD) 32. The PLL 32 converts the phase difference between the signals 41 and 42 into an analogue voltage. In the example shown the output unit 30 further comprises a low pass filter 34 having a relatively high bandwidth which smoothes the analogue voltage. The smoothed analogue voltage forms the output analogue signal 10. This configuration provides an output analogue signal 10 which is linear with phase with high precision.

In an embodiment the output analogue signal 10 is post processed by standard techniques, for example using level, gain and filtering blocks under control of a system microprocessor (not shown).

Figure 3:
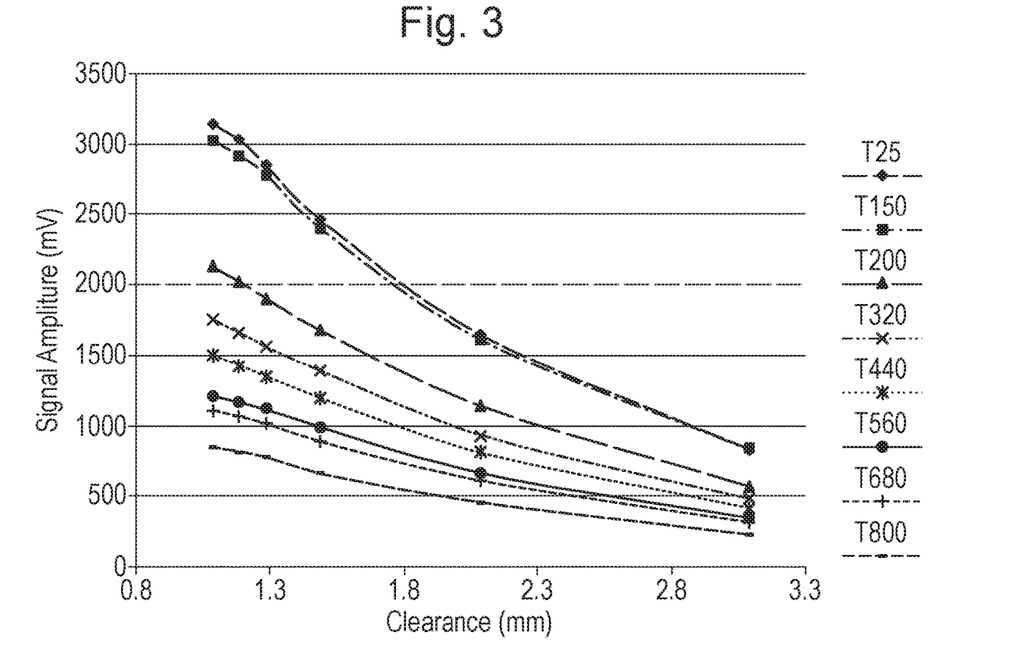
FIG. 3 is a graph showing example variations of an output from a reactance measuring apparatus against clearance between a sensor and a target object for eight different operating temperatures.
Figure 4:
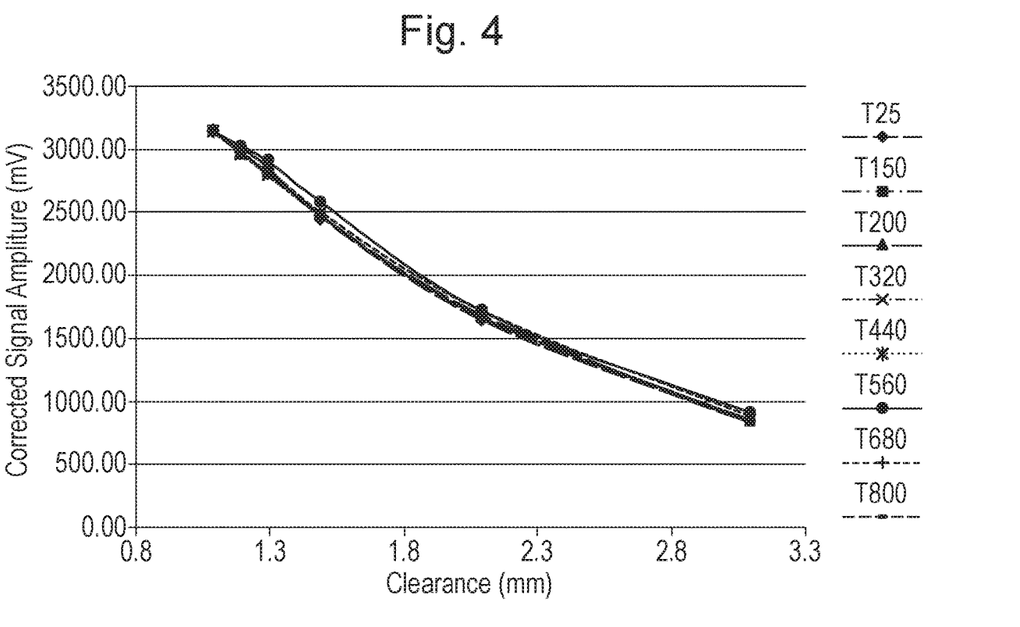
FIG. 4 is a graph showing a temperature corrected output against clearance for the eight different operating temperatures.

Variations in the temperature of the sensing component may affect how accurately the reactance can be measured and/or how accurately the measured reactance indicates the quantity that is being sensed by the sensor 4 (e.g. the proximity of a target object in the case of a proximity sensor). In an embodiment, such temperature effects are at least partially compensated for by providing a temperature measurement unit that is configured to measure the temperature of the sensing component. In an embodiment the temperature is measured by measuring the resistance of the sensing component. For example, in a case where the sensing component comprises a coil the resistance of the coil may be measured and used to determine the temperature. Many materials suitable for forming a coil, e.g. platinum, have resistivities which vary in a highly reproducible manner as a function of temperature. Indeed, many resistance thermometers are based on platinum strips or wires. Thus, by simultaneously measuring the reactance and resistance of the sensing component it is possible to obtain a temperature corrected measure of the reactance. The process is illustrated in the graphs of FIGS. 3 and 4. In FIG. 3 the vertical axis represents an output ("signal amplitude") from a reactance measurement apparatus of an embodiment in which the sensing component is a coil in a proximity sensor. The horizontal axis represents an actual clearance (measured independently) that the proximity sensor is intended to measure. Ideally the output from the reactance measurement apparatus should vary in the same way with the clearance at all temperatures but it can be seen that variations in temperature cause the curves to be displaced relative to each other. In FIG. 4 the vertical axis represents a corrected output ("corrected signal amplitude"). The corrected output is derived using a measurement of the temperature of the sensing component to correct for temperature effects. The measurement of temperature may be used to select appropriate calibration data for example. It can be seen that the correction leads to the eight separate curves substantially lying on top of each other. Thus, clearance is indicated directly and accurately by the corrected output over a wide range of temperatures (between 25° C. and 800° C. in the particular example shown).

A specific non-limiting example of a circuit for measuring the resistance of a sensing component (e.g. coil) 66 in a sensor 4 is described below with reference to FIGS. 5 and 6.

Figure 5:
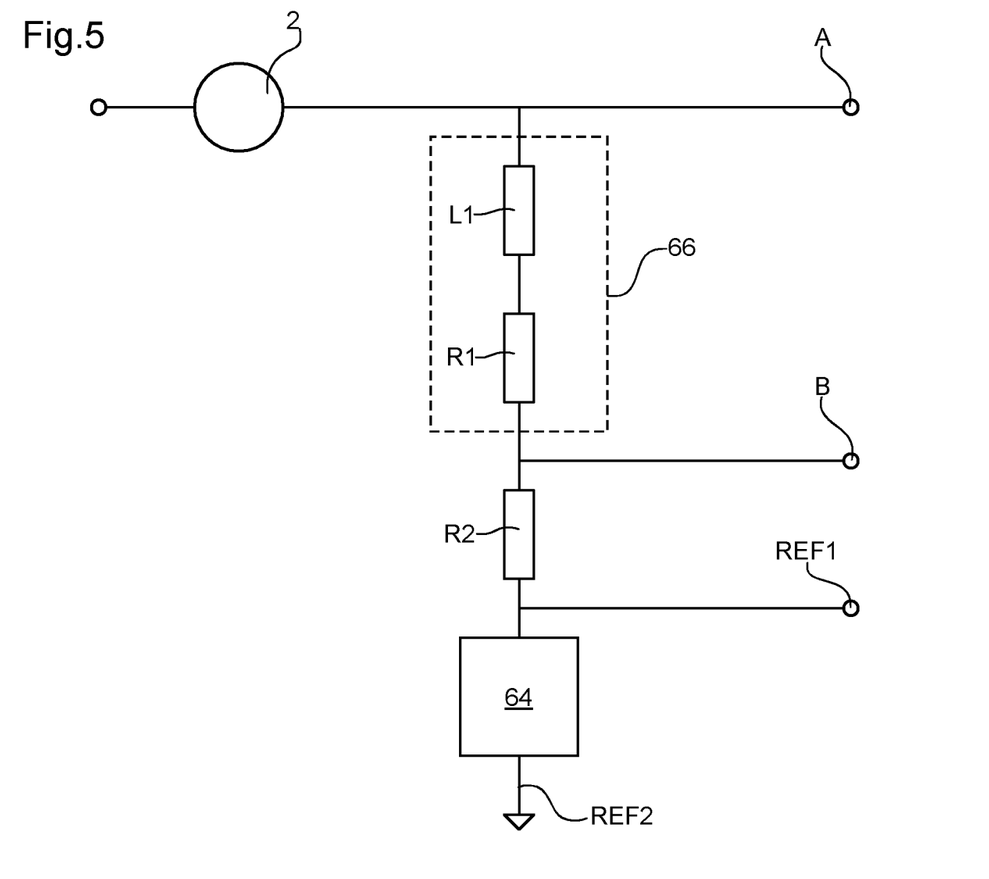
FIG. 5 depicts schematically an example circuit for measuring the resistance of a sensing component.

FIG. 5 is a schematic depiction of the circuit. An electrical source 2 is provided. The electrical source 2 may be the same electrical source 2 as is depicted in FIG. 1 or a different electrical source. The electrical source 2 is configured to provide a stable AC voltage, for example 1-2 MHz±3V, with respect to the reference REF2.

The sensing component 66 is depicted schematically as a combination of an inductor having inductance L1 and a resistor having resistance R1, respectively representing the inductance and resistance of the sensing component 66. At least the resistance R1 will typically have a significant temperature dependence.

A reference resistor having resistance R2 is also provided. The resistance R2 may be positioned in a less harsh environment than the sensing component 66 and thereby have a resistance which is relatively stable. The resistance R2 is typically subjected to less extreme temperatures than the sensing component 66 for example.

REF 1 is the signal reference to be used for determining the resistance R1 of the sensing component 66. REF 2 is a reference used for other purposes, for example to provide an output signal 10 that is a measure of the reactance of the sensing component 66 based on the measured phase, as described above with reference to FIGS. 1 and 2. Box 64 represents the network of components required to produce the REF 2. Box 64 may therefore contain components such as those described above with reference to FIGS. 1 and 2.

Figure 6:
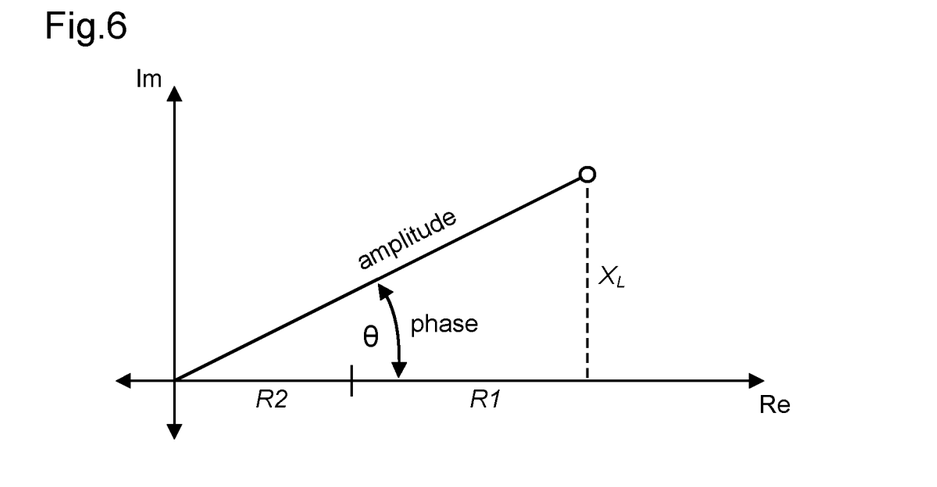
FIG. 6 depicts a phasor diagram showing real and imaginary parts of a reference voltage in the circuit of FIG. 5.

FIG. 6 is a diagram showing the voltage phasor diagram of the example circuit shown in FIG. 5. The phasor is referenced to REF 1. The diagram shows the real (Re) and imaginary (Im) components of the signal observed at A in the circuit of FIG. 5. Real components will be generated by current flowing through resistances R2 and R1. Imaginary components will be generated by reactive currents flowing through the inductance L1 of the sensing component 66. The inductive current will lag in phase.

The phase θ can be measured between A and B.

The reactance $X_L$ of an inductor is given by: $X_L = 2\pi f L$, where f is the frequency in Hz and L is the inductance in Henrys.

The current, I, flowing through the circuit of FIG. 5 may be determined by measuring the voltage V across R2 (i.e. between REF1 and B). This current is given by:

$$I = \frac{V}{R2}$$

The real and imaginary components in the voltage phasor diagram of FIG. 6 are proportional to the resistances and reactances involved. These are marked respectively as R1, R2 and $X_L$. It can be seen that by measuring the phase and amplitude of the signal REF1, and given also that R2 and $X_L$ are known, it is possible to extract the unknown resistance R1, as required.

The inductance L1 of the sensing component 66 may fluctuate in use due to the action of the sensor 4 (e.g. when a separation between the sensor 4 and a target object varies). However these fluctuations will typically be very small in comparison to the changes in the resistance R1 of the sensing component 66 due to variations in the temperature of the sensing component 66. For example, in the case where the sensing component 66 comprises a coil and is configured for use in turbo-machinery the resistance R1 may be expected to double (e.g. from about 20Ω to about 40Ω) as the coil is heated from ambient temperatures to full operating temperatures. The changes in inductance caused by changes in the separation between the sensor 4 and the target object in such applications will typically be of the order of a few parts per million (ppm). In an embodiment a low pass filter is used to filter out fluctuating variations in the signal, such as those caused by variations in the separation between the sensor 4 and the target object.

Figure 7:
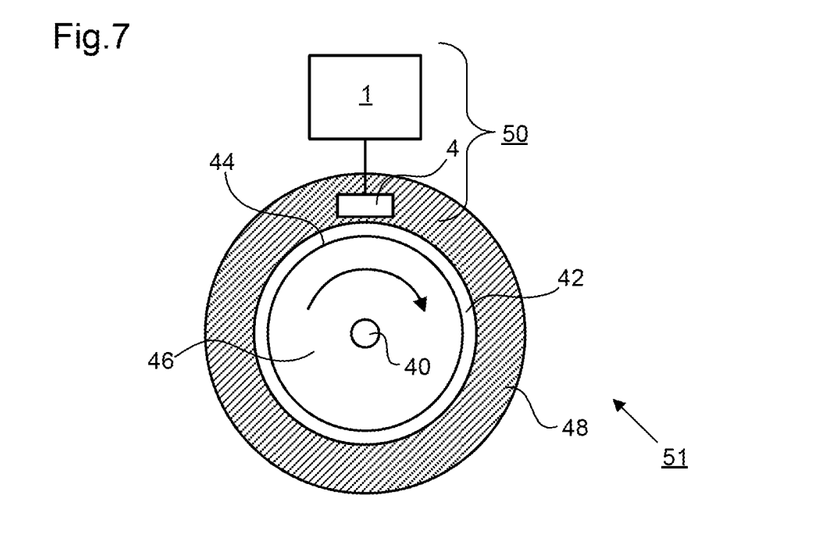
FIG. 7 is a schematic axial view of a proximity sensing system configured to detect a variation in a surface of a rotating shaft or disc in a turbo-machine assembly.

The configurations described above are highly immune to noise/interference and provides consistent sensitivity to very small changes in phase. The processing from output unit 30 onwards is DC and therefore well adapted for static measurements (non-modulated targets) such as measuring shafts and discs in turbo-machines assemblies. An example of an application of this type is shown in FIG. 7.

In the case where the sensor 4 is a proximity sensor, such that the reactance of the coil varies as a function of a proximity of an object to be detected, the combination of the sensor 4 and the reactance measuring apparatus 1 may be referred to as a proximity sensing system 50.

The proximity sensing system 50 may be used in a turbo-machine assembly 51 (e.g. a fan assembly, a turbine assembly, a compressor assembly, or an assembly comprising fan, turbine and/or compressor and/or one or more elements configured to operate selectively as a fan or as a turbine or as a compressor). For example, as illustrated schematically in FIG. 7 the proximity sensing system 50 may be used to detect a variation in a surface 44 of a shaft or disc 46 during rotation of the shaft or disc 46 about an axis 40. The variation may for example be a variation in a clearance 42 between the shaft or disc 46 and an adjacent component 48.

Figure 8:
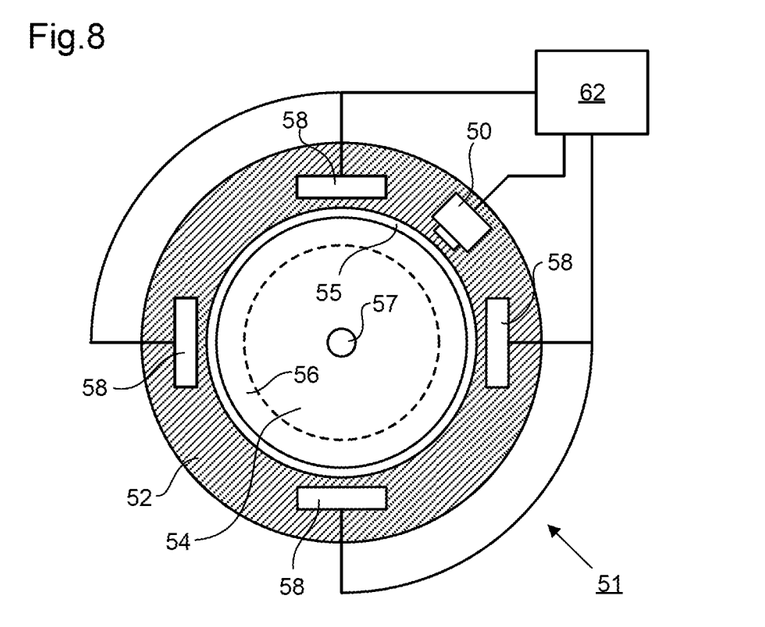
FIG. 8 is a schematic axial view of a turbo-machine assembly comprising a proximity sensing system configured to measure a clearance between blade tips and a casing.

FIG. 8 is a schematic depiction of a further example turbo-machine assembly 51 and implementation of the proximity sensing system therein. The depicted assembly 51 comprises a casing 52 and a fan or turbine 54 mounted within the casing 52. The fan or turbine 54 is mounted so as to be rotatable about axis 57. The fan or turbine 54 comprises a plurality of blades 56 (not shown individually) that extend radially outwards relative to the axis 57. A gap 55 between the radial tips of the blades 56 and the inner surface of the casing 52 may be referred to as a "clearance" between the blades 56 and the casing 52.

As explained in the introductory part of the description, it is desirable to minimise the size of the clearance between the blades 56 and the casing 52 in order to favour high operating efficiency, subject to avoiding excessive contact between the blades 56 and the casing 52.

In an embodiment, a controller 62 is provided for controlling the size and/or shape of the casing 52 based on the clearance detected by a proximity sensing system 50. In an embodiment, the controller 62 is connected to control elements 58, which may be heating or cooling systems and/or mechanical actuators, for example. A control signal for controlling these elements is transmitted to them by the controller 62 based on the output from the proximity sensing system 50. In other embodiments, the controller 62 and/or control elements 58 may not be provided and the proximity sensor 50 may be used instead for development or diagnostic purposes only. For example, in an embodiment, the assembly may be configured to enter a shut down procedure if the proximity sensor 50 detects that the clearance between the blades 56 and the casing 52 falls below a threshold safety level.

In the embodiment shown, the proximity sensing system 50 is configured to measure clearance at a single circumferential position. In other embodiments the proximity sensing system 50 may comprise multiple proximity sensors to measure the clearance at a plurality of different circumferential positions to enable the measurement of anisotropic (i.e. azimuthally varying rather than axially symmetric) clearance. In the context of turbo-machine assembly for use in aircraft engines, such anisotropic clearance may occur due to loading on the assemblies during flight for example.

Figure 9:
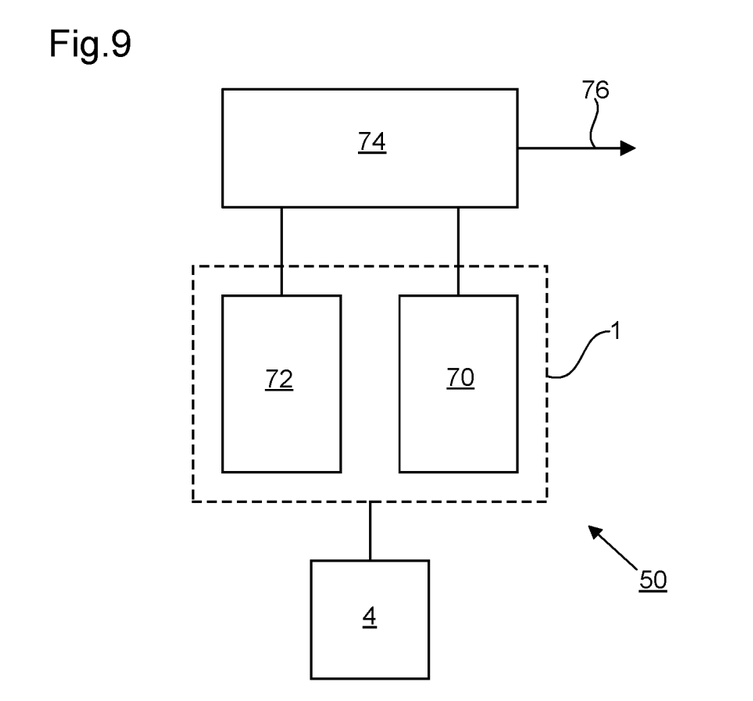
FIG. 9 depicts schematically a proximity sensing system comprising a temperature measurement unit and a processing unit.

FIG. 9 depicts an example proximity sensing system 50 which is configured to carry out temperature correction as described above with reference to FIGS. 3-6. The system 50 comprises a reactance measuring apparatus 1. The apparatus 1 comprises a reactance measurement unit 70. The reactance measurement unit 70 may be configured as described above having reference to FIGS. 1 and 2 for example. The apparatus 1 further comprises a temperature measurement unit 72. The temperature measurement unit 72 may be configured as described above with reference to FIGS. 5 and 6 for example. In an embodiment the temperature measurement unit 72 is configured to measure the temperature of the sensing component by measuring the resistance of the sensing component. In an embodiment the sensing component comprises a coil and the temperature of the coil is obtained by measuring the resistance of the coil and comparing the measured resistance with calibration data. In an embodiment the system 50 further comprises a processing unit 74. The processing unit 74 is configured to output a measure of the proximity of a target object based on the measured reactance and the measured temperature of the sensing component (e.g. by using the measured temperature to select an appropriate correction to a signal representing the measured reactance, as described above with reference to the graphs in FIGS. 3 and 4). In an embodiment the processing unit 74 is configured to provide an output 76 comprising a temperature corrected measure of the proximity of the target object. The temperature measurement unit 72 is shown in this example as being part of the reactance measurement apparatus 1, but this is not essential. The processing unit 74 is shown as being separate from the reactance measuring apparatus 1, but this is not essential. The reactance measurement unit 70 and the temperature measurement unit 72 are shown as separate units, but this is not essential.

The features defined in the claims may be used together in any combination.

The invention claimed is:

1. A turbo-machine assembly comprising:
   a shaft or disc configured to rotate;
   a proximity sensor having a sensing component comprising a coil, wherein a reactance of the sensing component varies as a function of a proximity of the shaft or disc;
   a circuit comprising the sensing component and a unit having fixed reactance;
   an electrical source configured to drive an alternating current through the circuit; and
   an analysis unit configured to:
   measure a phase of a signal in the circuit that is dependent on the reactance of the sensing component of the sensor; and
   detect and output a measured variation in a surface of the shaft or disc during rotation of the shaft or disc, the measured variation being obtained by measuring the reactance of the sensing component based on the measured phase.

2. The assembly of claim 1, wherein
   the electrical source is configured to drive the alternating current through the sensing component via the unit having fixed reactance; and
   the phase measured by the analysis unit is the phase of a signal generated at a reference point between the sensing component and the unit having fixed reactance.

3. The assembly of claim 1, wherein
   the circuit is configured simultaneously to drive equal and opposite alternating currents through the sensing component via respective first and second units having fixed reactance; and
   the analysis unit is configured to combine a first signal with a second signal, the first signal being obtained at a first reference point between the sensing component and the first unit, and the second signal being obtained at a second reference point between the sensing component and the second unit, wherein
   the phase measured by the analysis unit is a phase of a signal obtained by combining the first and second signals.

4. The assembly of claim 3, wherein the reactance of the first unit is the same as the reactance of the second unit.

5. The assembly of claim 1, further comprising:
   a temperature measurement unit configured to measure a temperature of the sensing component by measuring a resistance of the sensing component.

6. The assembly of claim 1, further comprising a first limiting amplifier and a second limiting amplifier, wherein the phase of a signal in the circuit is measured by:
   passing the signal through the first limiting amplifier;
   passing an output from the electrical source through the second limiting amplifier; and
   obtaining the phase of the signal by obtaining the phase of the output of the first limiting amplifier relative to the phase of the output of the second limiting amplifier.

7. The assembly of claim 6, wherein the analysis unit is configured to output an analogue voltage proportional to the measured phase of the signal.

8. The assembly of claim 7, wherein the analogue voltage is obtained using a phase locked loop phase detector and low pass filter.

9. The assembly of claim 1, further comprising:
   a reactance measuring apparatus having a temperature measurement unit configured to measure a temperature of the sensing component by measuring a resistance of the sensing component; and
   a processing unit configured to output a measure of the proximity of the shaft or disc based on the measured reactance and the measured temperature of the sensing component.

10. A turbo-machine assembly, comprising:
    a casing;
    a fan or turbine including a blade and mounted rotatably within the casing;
    a proximity sensor having a sensing component comprising a coil, wherein a reactance of the sensing component varies as a function of a proximity of the blade;
    a circuit comprising the sensing component and a unit having fixed reactance;
    an electrical source configured to drive an alternating current through the circuit; and
    an analysis unit configured to:
    measure a phase of a signal in the circuit that is dependent on the reactance of the sensing component of the sensor; and
    detect and output a measured clearance between the blade and a portion of an inner surface of the casing.

11. The assembly of claim 10, wherein
    the electrical source is configured to drive the alternating current through the sensing component via the unit having fixed reactance; and
    the phase measured by the analysis unit is the phase of a signal generated at a reference point between the sensing component and the unit having fixed reactance.

12. The assembly of claim 10, wherein
    the circuit is configured simultaneously to drive equal and opposite alternating currents through the sensing component via respective first and second units having fixed reactance; and
    the analysis unit is configured to combine a first signal with a second signal, the first signal being obtained at a first reference point between the sensing component and the first unit, and the second signal being obtained at a second reference point between the sensing component and the second unit, wherein
    the phase measured by the analysis unit is a phase of a signal obtained by combining the first and second signals.

13. The assembly of claim 12, wherein the reactance of the first unit is the same as the reactance of the second unit.

14. The assembly of claim 10, further comprising:
    a temperature measurement unit configured to measure a temperature of the sensing component by measuring a resistance of the sensing component.

15. The assembly of claim 10, further comprising a first limiting amplifier and a second limiting amplifier, wherein the phase of a signal in the circuit is measured by:
    passing the signal through the first limiting amplifier;
    passing an output from the electrical source through the second limiting amplifier; and
    obtaining the phase of the signal by obtaining the phase of the output of the first limiting amplifier relative to the phase of the output of the second limiting amplifier.

16. The assembly of claim 15, wherein the analysis unit is configured to output an analogue voltage proportional to the measured phase of the signal.

17. The assembly of claim 16, wherein the analogue voltage is obtained using a phase locked loop phase detector and low pass filter.

18. The assembly of claim 10, further comprising:
    a reactance measuring apparatus having a temperature measurement unit configured to measure a temperature of the sensing component by measuring a resistance of the sensing component; and a processing unit configured to output a measure of the proximity of the blade based on the measured reactance and the measured temperature of the sensing component.

19. A method of detecting a variation in a surface of a shaft or disc of a turbo-machine assembly, comprising:

driving an alternating current through a circuit comprising a sensing component of a proximity sensor and a unit having fixed reactance, wherein the sensing component has a coil, and a reactance of the sensing component varies as a function of a proximity of the shaft or disc;

measuring a phase of a signal in the circuit that is dependent on the reactance of the sensing component; and detecting and outputting a measured variation in the surface of the shaft or disc during rotation of the shaft or disc, the measured variation being obtained by measuring the reactance of the sensing component based on the measured phase.

20. A method of detecting a clearance between a blade and a portion of an inner surface of a casing of a turbo-machine assembly, comprising:

driving an alternating current through a circuit comprising a sensing component of a proximity sensor and a unit having fixed reactance, wherein the sensing component has a coil, and a reactance of the sensing component varies as a function of a proximity of the blade;

measuring a phase of a signal in the circuit that is dependent on the reactance of the sensing component; and detecting and outputting a measured clearance between the blade and the portion of the inner surface of the casing, the measured clearance being obtained by measuring the reactance of the sensing component based on the measured phase.

* * * * *